(12) United States Patent
Lin et al.

(10) Patent No.: US 7,586,609 B2
(45) Date of Patent: Sep. 8, 2009

(54) METHOD FOR ANALYZING OVERLAY ERRORS

(75) Inventors: Shun-Li Lin, Hsinchu (TW); Chen-Fu Chien, Hsinchu (TW); Chia-Yu Hsu, Hsinchu (TW); I-Pien Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 239 days.

(21) Appl. No.: 11/112,115

(22) Filed: Apr. 21, 2005

(65) Prior Publication Data

US 2006/0238761 A1    Oct. 26, 2006

(51) Int. Cl.
    *G01B 11/00*    (2006.01)
(52) U.S. Cl. .................................................. 356/401
(58) Field of Classification Search .......... 356/399–401
    See application file for complete search history.

(56) References Cited

U.S. PATENT DOCUMENTS

| | | | | |
|---|---|---|---|---|
| 5,444,538 A | * | 8/1995 | Pellegrini ................... | 356/401 |
| 5,894,350 A | * | 4/1999 | Hsieh et al. .................. | 356/399 |
| 6,008,880 A | * | 12/1999 | Higashiki et al. ............. | 355/53 |
| 6,266,144 B1 | * | 7/2001 | Li ............................... | 356/401 |
| 6,573,986 B2 | * | 6/2003 | Smith et al. .................. | 356/124 |
| 6,899,982 B2 | * | 5/2005 | McArthur et al. ............. | 430/22 |
| 6,908,775 B2 | * | 6/2005 | Heine et al. ................... | 438/14 |
| 2002/0183989 A1 | | 12/2002 | Chien et al. .................... | 703/2 |
| 2003/0115556 A1 | | 6/2003 | Conrad et al. ................. | 716/4 |
| 2005/0195397 A1 | * | 9/2005 | Ho et al. ...................... | 356/400 |

\* cited by examiner

*Primary Examiner*—Tarifur R. Chowdhury
*Assistant Examiner*—Isiaka O Akanbi
(74) *Attorney, Agent, or Firm*—J.C. Patents

(57) ABSTRACT

A method for analyzing overlay errors in lithography is described. Interfield sampling and intrafield sampling are first conducted to sample multiple positions on each of the wafers, and then the overlay error value at each of the positions is measured. An overlay error model including coefficients of intrafield and interfield overlay errors of different types is used to fit the measured overlay error values with respect to the sampled positions. In the overlay error model, the intrafield overlay errors include intrafield translation, isotropic magnification, reticle rotation, asymmetric magnification and asymmetric rotation, and the interfield overlay errors include interfield translation, scale error, wafer rotation and orthogonality error.

11 Claims, 5 Drawing Sheets

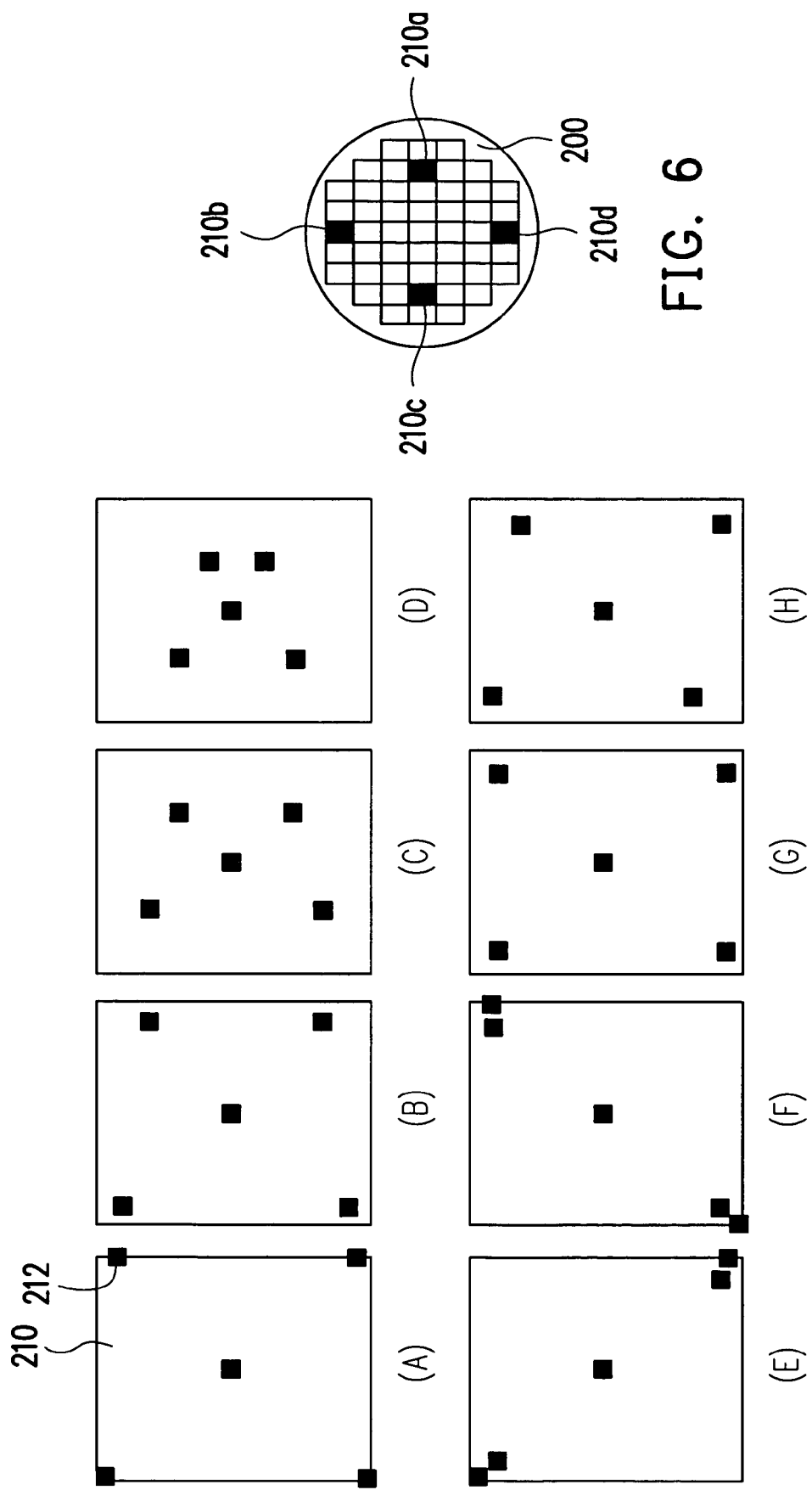

| Sampling patterns of this invention | 1 | 2 | 3 | 4 |
|---|---|---|---|---|
| Erron norm (μm) | 0.720 | 0.700 | 0.605 | 0.602 |
| Sampling patterns of the prior art | 5 | 6 | 7 | 8 |
| Erron norm (μm) | 0.813 | 0.793 | 0.732 | 0.715 |

FIG. 9

METHOD FOR ANALYZING OVERLAY ERRORS

BACKGROUND OF THE INVENTION

1. Field of the Invention

The present invention relates to photolithography processes. More particularly, the present invention relates to a method for analyzing overlay errors that occur in a lithography process. The method utilizes a new overlay error model to improve the accuracy of overlay error analyses.

2. Description of the Related Art

With decreasing feature sizes and shrinking linewidths of integrated circuits, lithography has become critical for semiconductor manufacture. As the tolerance of linewidth error is increasingly small, lithography machines have been upgraded from step-and-repeat systems (steppers) to advanced step-and-scan systems (scanners). To enhance the resolution and alignment accuracy in lithography, it is necessary to control the overlay errors of lithography to within a tolerance.

Overlay errors are the displacements of present layers relative to the preceding layers, and can be controlled by modifying the equipment setup parameters. For example, US Patent Application Publication No. 2003/0115556 to Conrad et al. discloses a feed-forward method based on correlation of current and prior aligned levels to predict optimum overlay offsets for a given lot.

There have been numerous studies on overlay error modeling and sampling strategies, wherein the overlay errors are generally divided into intrafield overlay errors that occur in one field, i.e., one exposure shot, and interfield overlay errors that occur across the whole wafer. For example, US Patent Application Publication No. 2002/0183989 to Chien et al. discloses an overlay error model and a sampling strategy for steppers. However, most of the existing studies are focused on stepper lithography, while fewer works have addressed overlay error models of the advanced scanner lithography and corresponding sampling strategies. The overlay error models suitable for lithography processes using steppers mostly do not fit for those using scanners.

For lithography processes using scanners, the intrafield overlay errors may come from intrafield translation, isotropic magnification, reticle rotation, asymmetric rotation and asymmetric magnification that are illustrated in FIG. 1, as well as from field skew, scan magnification and scan skew, etc. The interfield overlay errors may come from interfield translation, scale error, wafer rotation and orthogonality error that are illustrated in FIG. 2. Intrafield translation error is caused by translation of the reticle, and isotropic magnification error occurs when the lens moves closer to the reticle or to the wafer. In particular, asymmetric magnification and rotation are caused by the relative movement of the reticle stage and the wafer stage. Interfield translation error is caused by translation of the wafer. Scale error will occur if an absolute movement is given to the stage but results in the stage moving by another amount. Orthogonality error is caused by that the X-Y coordinate system is not parallel to the wafer stage.

However, none of the conventional overlay models fits well enough for lithography processes using scanners. Therefore, the overlay errors occurring in a lithography process using a scanner cannot be analyzed correctly and compensated effectively, so that the accuracy of pattern transfer is difficult to improve.

SUMMARY OF THE INVENTION

In view of the forgoing, this invention provides a method for analyzing overlay errors. The method uses a new overlay error model, and is suitably used to analyze the overlay errors occurring in a lithography process using a scanner.

This invention also provides a new sampling strategy, especially a new interfield sampling pattern, which is suitably used together with the new overlay error model to further improve the performance of the overlay analyzing method of this invention.

The inventors discovered that, for scanner lithography, the interfield overlay errors including intrafield translation, scale error, wafer rotation and orthogonality error and the intrafield overlay errors including intrafield translation, isotropic magnification, reticle rotation, asymmetric magnification and asymmetric rotation are more important than other overlay errors. Therefore, in the method for analyzing overlay errors of this invention, the nine types of intrafield and interfield overlay errors are considered in the overlay error model. After the intrafield/interfield sampling is done, the coordinates of the sampled positions and the overlay error values thereat are fitted using the above model. The coefficients of the nine types of overlay errors can be obtained using a least square method.

In the above method of this invention, the intrafield sampling pattern preferably includes at least five positions with four around the four corners of a field and one around the center of the field.

On the other hand, the interfield sampling pattern of this invention includes at least four fields that have four different X-coordinates and four different Y-coordinates, wherein each field is apart from the center of the wafer by at least 50% of the radius of the wafer, and an angle between any two fields with respect to the center of the wafer is at least 30°. The interfield sampling pattern may further include one field around the center of the wafer, so as to further improve the accuracy of overlay error analyses.

In more preferable embodiments of this invention, the above intrafield sampling pattern of "four corners plus center" type and the new interfield sampling pattern of this invention are used in combination to further improve the accuracy of overlay error analyses. The sampling strategy is also a part of this invention.

It is to be understood that both the foregoing general description and the following detailed description are exemplary, and are intended to provide further explanation of the invention as claimed.

BRIEF DESCRIPTION OF THE DRAWINGS

FIG. 5 illustrates eight intrafield sampling patterns for evaluation, wherein the patterns (A), (B), (C) and (D) are examples of this invention.

FIG. 6 shows the interfield sampling pattern applied in the above evaluation of intrafield sampling patterns.

FIG. 9 lists the error norms of different overlay analyses using two interfield sampling patterns of this invention and two of the prior art, respectively, with an intrafield sampling pattern of "four corners plus center" or "four corners only" type.

DESCRIPTION OF THE PREFERRED EMBODIMENTS

Figure 1:
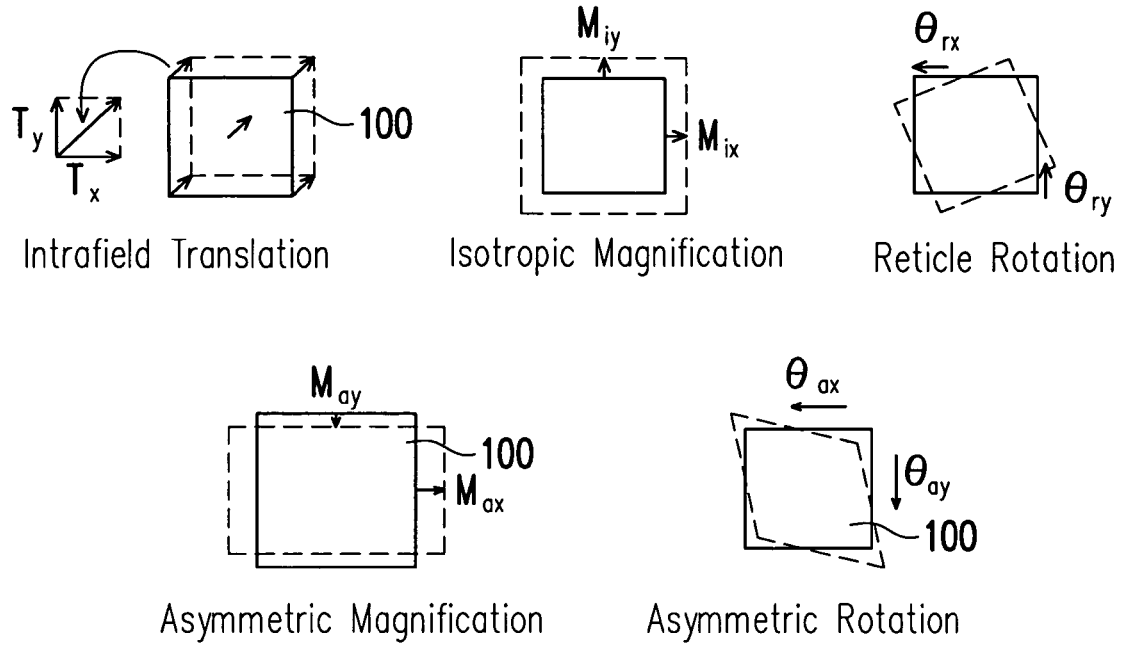
FIG. 1 illustrates some of the intrafield overlay errors considered in a lithography process using a scanner.
Figure 2:
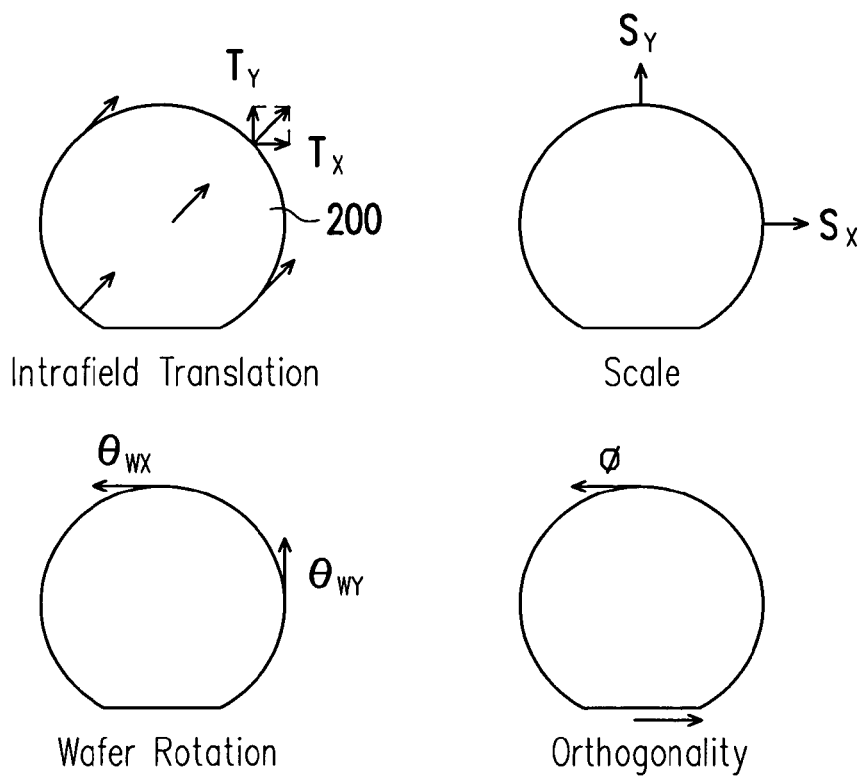
FIG. 2 illustrates some of the interfield overlay errors considered in a lithography process using a scanner.

As mentioned above, in the overlay error model of this invention, the interfield overlay errors include intrafield translation, scale error, wafer rotation and orthogonality error, and intrafield overlay errors include intrafield translation, isotropic magnification, reticle rotation, asymmetric magnification and asymmetric rotation. According to the preferred embodiment of this invention, the overlay error model can be expressed by the following simultaneous polynomial equations:

$$d_{x+X} = T_{x+X} + S_X X - (\theta_w + \phi)Y + (M_i + M_a)x - (\theta_r + \theta_a)y + \epsilon_{x+X} \quad (1)$$

$$d_{y+Y} = T_{y+Y} + S_Y Y + \theta_w X + (M_i - M_a)y + (\theta_r - \theta_a)x + \epsilon_{y+Y} \quad (2)$$

wherein x and y are intrafield coordinates in one field, X and Y are interfield coordinates on the wafer, $d_{x+X}$ is the sum of the intrafield and interfield overlay errors in x-axis direction, $d_{y+Y}$ is the sum of the intrafield and interfield overlay errors in y-axis direction, $T_{x+X}$ is the sum of the intrafield and interfield translation overlay errors in x-axis direction, $T_{y+Y}$ is the sum of the intrafield and interfield translation overlay errors in y-axis direction, $S_X$ is the scale in x-axis direction, $S_Y$ is the scale in y-axis direction, $\theta_w$ is the coefficient of wafer rotation, $\phi$ is the coefficient of orthogonality error, $M_i$ is the coefficient of isotropic magnification, $M_a$ is the coefficient of asymmetric magnification, $\theta_r$ is the coefficient of reticle rotation, $\theta_a$ is the coefficient of asymmetric rotation, and $\epsilon_{x+X}$ and $\epsilon_{y+Y}$ are residue overlay errors in x-axis direction and in y-axis direction, respectively.

It is particularly noted by the inventors that the above polynomial equations (1) and (2) fit well enough for the overlay errors, and higher-order terms like $x^2$, $y^2$ or $(x^2+y^2)$ terms are not necessary. After hundreds or thousand positions are sampled from the wafers and the overlay errors $d_{x+X}$ and $d_{y+Y}$ at each position are measured, the x-, y-, X- and Y-coordinates and overlay errors $d_{x+X}$ and $d_{y+Y}$ of the positions can be fitted with the above model using a least square method described as follows.

In the least square method, the following equations (3) and (4) are used for fitting, and the ten coefficients as listed in Table 2 are to be estimated.

$$d_{x+X} = \hat{T}_{x+X} + \hat{S}_X X - (\hat{\theta}_w + \hat{\phi})Y + (\hat{M}_i + \hat{M}_a)x - (\hat{\theta}_r + \hat{\theta}_a)y \quad (3)$$

$$d_{y+Y} = \hat{T}_{y+Y} + \hat{S}_Y Y + \hat{\theta}_w X + (\hat{M}_i - \hat{M}_a)y + (\hat{\theta}_r - \hat{\theta}_a)x \quad (4)$$

The goal of the least square fitting is to minimize the error norm, which is defined as $$\text{Error norm } (v) = \sqrt{\sum_i \Delta r_i^2} = \sqrt{\sum_i (e_{x+X,i}^2 + e_{y+Y,i}^2)} \quad (5)$$

wherein $e_{x+X,i} = d_{x+X,i} - \hat{d}_{x+X}$, $e_{y+Y,i} = d_{y+Y,i} - \hat{d}_{y+Y}$ and "i" is the index of the sampled positions. To simplify the fitting procedure, Eqs. (3) and (4) are further transformed to the following equations (6)-(7):

$$d_{x+X} = t_x + s_X X - r_X Y + m_x x - r_x y \quad (6)$$

$$d_{y+Y} = t_y + r_Y X + s_Y Y + r_y x + m_y y \quad (7)$$

wherein the transformation relationships are shown in Table 1 and Table 2:

TABLE 1

|  | constant | X | Y | x | Y |
|---|---|---|---|---|---|
| X/x-direction | | | | | |
| Regression coefficient | $t_x$ | $s_X$ | $r_X$ | $m_x$ | $r_x$ |
| Coefficient in present model | $\hat{T}_{x+X}$ | $\hat{S}_X$ | $\hat{\theta}_w + \hat{\phi}$ | $\hat{M}_i + \hat{M}_a$ | $\hat{\theta}_r + \hat{\theta}_a$ |
| Y/y-direction | | | | | |
| Regression coefficient | $t_y$ | $r_Y$ | $s_Y$ | $r_y$ | $m_y$ |
| Coefficient in present model | $\hat{T}_{y+Y}$ | $\hat{\theta}_w$ | $\hat{S}_Y$ | $\hat{\theta}_r - \hat{\theta}_a$ | $\hat{M}_i - \hat{M}_a$ |

TABLE 2

| Estimated coefficient | $\hat{T}_{x+X}$ | $\hat{T}_{y+Y}$ | $\hat{S}_X$ | $\hat{S}_Y$ | $\hat{\theta}_w$ |
|---|---|---|---|---|---|
| Regression coefficient | $t_x$ | $t_y$ | $s_X$ | $s_Y$ | $r_Y$ |
| Estimated coefficient | $\hat{\phi}$ | $\hat{M}_i$ | $\hat{\theta}_r$ | $\hat{M}_a$ | $\hat{\theta}_a$ |
| Regression coefficient | $r_x - r_y$ | $\dfrac{m_x + m_y}{2}$ | $\dfrac{r_x + r_y}{2}$ | $\dfrac{m_x - m_y}{2}$ | $\dfrac{r_x - r_y}{2}$ |

After the ten coefficients in Eqs. (6) and (7) are obtained with the least square method, the ten coefficients in Eqs. (3) and (4) can be calculated according to the transformation relationships listed in Table 2.

Figure 3:
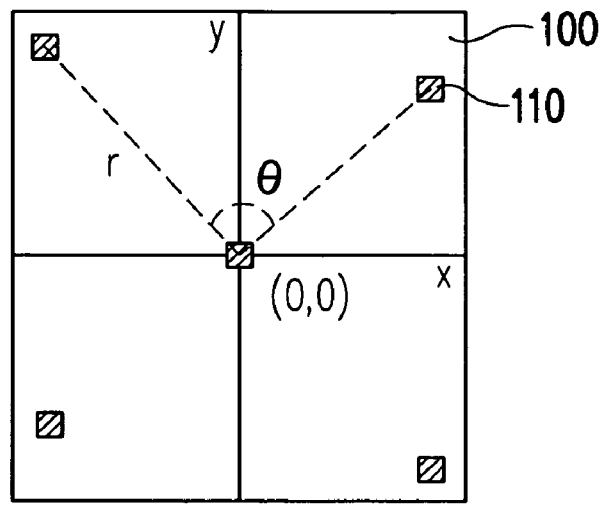
FIG. 3 shows a model for illustrating the preferable intrafield sampling patterns according to a preferred embodiment of this invention.

FIG. 3 shows a model for illustrating the preferable intrafield sampling patterns according to the preferred embodiment of this invention. The intrafield sampling pattern, which is preferably used in combination with the above overlay error model, includes at least five positions 110, wherein four sampled positions 110 are around the four corners and a field 100 and one position 100 around the center of the field 100, preferably at the center of the field 100.

Figure 4:
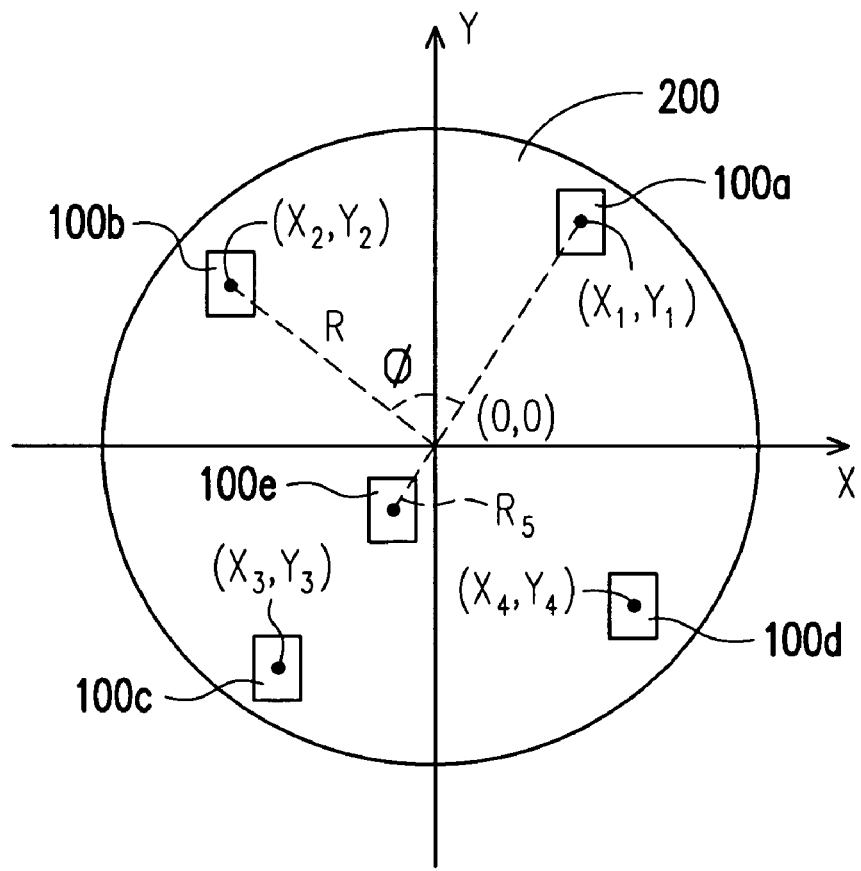
FIG. 4 shows a model for illustrating the interfield sampling patterns of this invention.

FIG. 4 shows a model for illustrating the interfield sampling patterns of this invention. The interfield sampling pattern includes at least four fields 100a, 100b, 100c and 100d that have four different X-coordinates and four different Y-coordinates on the wafer 200, wherein the coordinates of a field means the coordinates of the center of the field in the whole specification of this invention. The distance "R" between the center of any field 100 and the center (0, 0) of the wafer 200 is at least 50% of the radius of the wafer, and an angle "φ" between any two fields 100 with respect to the center of the wafer 200 is at least 30°. The interfield sampling pattern may further include one field 100e around the center of the wafer 200 to further improve the accuracy of overlay error analyses, wherein the distance between the field 110e and the center of the wafer 200 is preferably no more than ⅕ of the radius of the wafer 200. The field 10e may even be the one at the center of the wafer 200.

EXAMPLES

The preferable intrafield sampling pattern in FIG. 3 and the interfield sampling pattern of this invention illustrated in FIG. 4 are evaluated in the following examples. The preferable intrafield sampling pattern in combination with a fixed conventional interfield sampling pattern is evaluated first, and then the interfield sampling pattern of this invention in combination with a fixed intrafield sampling pattern is evaluated. Finally, combinations of different intrafield and interfield sampling patterns including the interfield sampling patterns of this invention and the preferable intrafield sampling patterns, like in FIG. 9, are compared.

<Evaluation of Intrafield Sampling Patterns>

FIG. 5 illustrates eight intrafield sampling patterns for evaluation, wherein the patterns (A), (B), (C) and (D) of "four corners plus center" type are examples of this invention. FIG. 6 shows the fixed interfield sampling pattern applied in the evaluation. The interfield sampling pattern of FIG. 6 is not an interfield sampling pattern of this invention for the fields 210a and 210c having the same Y-coordinate and the fields 210b and 210d having the same X-coordinate. The evaluation is based on numerical simulations and least square fitting as described below.

For each intrafield sampling pattern in FIG. 5 in combination with the fixed interfield sampling pattern of FIG. 6, a simulation is conducted by calculating the overlay error vectors ($d_{x+X}$, $d_{y+Y}$) at 45 positions in each of the 51 fields (210) on the wafer 200. For each of the 45 positions in each field 210, the corresponding overlay error vector is calculated by respectively calculating and then summing the nine displacement vectors caused by the nine overlay errors in FIGS. 1/2. Accordingly, there are totally 2295 (=45×51) positions being simulated on the wafer 200, while the intrafield and interfield sampling merely takes 20 (=4×5) positions (212) for the least square fitting. After the ten coefficients in Eqs. (3) and (4) are obtained from the fitting based on the 20 positions (212), the estimated overlay errors ($\hat{d}_{x+X}$, $\hat{d}_{y+Y}$) at all 2295 positions are calculated using Eqs. (3) and (4), and an error norm is calculated over the 2295 positions according to Eq. (5):

$$\text{Error norm } (v) = \sqrt{\Delta r_1^2 + \Delta r_2^2 + \ldots + \Delta r_{2295}^2}$$

The results of fitting are listed in Table 3, including the $R^2$ coefficients and error norms.

TABLE 3

| | Sampling pattern | | | | | | | |
|---|---|---|---|---|---|---|---|---|
| | A* | B* | C | D | E | F | G* | H* |
| $R^2$ (%) | 99.91 | 99.92 | 99.81 | 99.85 | 99.86 | 99.83 | 99.92 | 99.96 |
| Error norm (μm) | 0.732 | 0.664 | 0.984 | 1.168 | 2.131 | 3.018 | 0.656 | 0.639 |

*Examples of this invention

Referring to FIG. 3 again, based on the results of B, C and D, it is concluded that the larger the distance "r" between each sampled position 110 and the center of the field 100, the smaller the error norm, i.e., the higher the accuracy of the overlay analysis. According to the results of A, E and F, it is concluded that the larger the smallest angle "θ" between certain two positions 110 with respect to the center of the field 100, the higher the accuracy of the overlay analysis. It is therefore apparent that the intrafield sampling patterns of "four corners plus center" type are preferable for the above model of this invention, since the error norms caused by the intrafield sampling patterns A, B, G and H are much smaller than those caused by the other sampling patterns.

Moreover, considering that the sampling pattern A results in an error norm remarkably larger than those resulting from B, C and D, it is more preferable not to select any position at the boundary of a field.

<Evaluation of Interfield Sampling Patterns>

Figure 7:
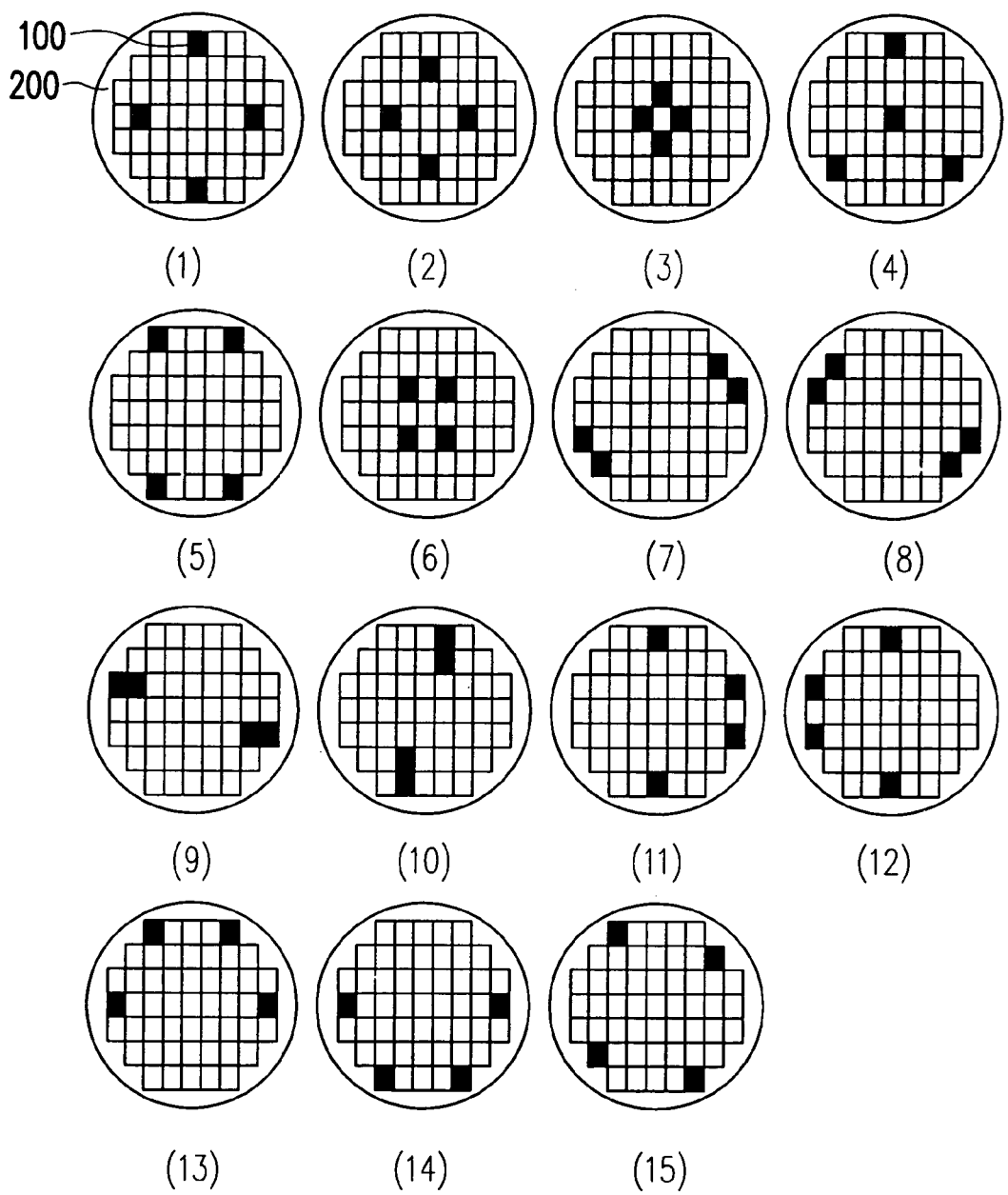
FIG. 7 illustrates fifteen interfield sampling patterns for evaluation, wherein the interfield sampling pattern (15) is an interfield sampling pattern of this invention.
Figure 8:
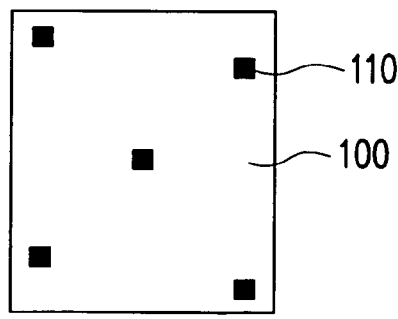
FIG. 8 shows the intrafield sampling pattern applied in the above evaluation of interfield sampling patterns.

FIG. 7 illustrates fifteen interfield sampling patterns for evaluation, wherein the interfield sampling pattern (15) is an interfield sampling pattern of this invention as defined above. FIG. 8 shows the fixed intrafield sampling pattern applied in the evaluation. Each wafer 200 has many fields 100 thereon, wherein each sampled field 100 includes five positions 110 selected in the intrafield sampling. The evaluation is also based on numerical simulations and subsequent least square fitting as described above, and the results of fitting are listed in Table 4.

TABLE 4

| | Sampling pattern | | | | | | | |
|---|---|---|---|---|---|---|---|---|
| | 1 | 2 | 3 | 4 | 5 | 6 | 7 | 8 |
| $R^2$ (%) | 99.96 | 99.92 | 99.81 | 99.95 | 99.96 | 99.83 | 99.82 | 99.95 |
| Error norm (μm) | 0.639 | 0.714 | 0.862 | 0.760 | 0.620 | 0.834 | 0.750 | 0.732 |

| | Sampling pattern | | | | | | |
|---|---|---|---|---|---|---|---|
| | 9 | 10 | 11 | 12 | 13 | 14 | 15* |
| $R^2$ (%) | 99.91 | 99.99 | 99.96 | 99.97 | 99.94 | 99.92 | 99.97 |
| Error norm (μm) | 3.502 | 2.194 | 0.873 | 0.840 | 1.112 | 1.087 | 0.605 |

*Interfield sampling pattern of this invention

It is apparent that the interfield sampling pattern of this invention as defined above is preferable for the above overlay model, since the error norm caused by the interfield sampling pattern (15) is remarkably smaller than that caused by the interfield sampling pattern (1) that is usually used in the prior art, and is much smaller than the error norms caused by the other interfield sampling patterns (2-14).

<Evaluation of Overall Sampling Strategy>

FIG. 9 lists the error norms of different overlay analyses using two interfield sampling patterns of this invention and two of the prior art, respectively, with an intrafield sampling pattern of the preferable "four corners plus center" type or "four corners only" type. The effects of the sampling strategy of this invention can be seen from FIG. 9.

As indicated by the comparison of Examples 1-4 and Examples 5-8, no matter whether the intrafield sampling pattern includes the central position of the field, the error norms caused by the interfield sampling patterns of this invention are much smaller than those caused by the interfield sampling patterns of the prior art.

Moreover, as indicated the comparison of Examples 1 and 3, 2 and 4, 5 and 7, or 6 and 8, including the central position of the field in the intrafield sampling pattern can also reduce the error norm effectively.

Furthermore, inclusion of a field around the center of the wafer in the interfield sampling pattern of this invention can also reduce the error norm, as shown by the comparison between Examples 1 and 2, or 3 and 4. In summary, the particularly preferable sampling strategy of this invention includes an intrafield sampling pattern of "four corners plus center" type and an interfield sampling pattern of this invention that also includes a field around the center of the wafer.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for analyzing overlay errors in lithography, comprising:

performing interfield sampling and intrafield sampling to sample a plurality of positions on a wafer;

measuring an overlay error value at each of the positions; and using an overlay error model including coefficients of intrafield and interfield overlay errors of different types to fit the measured overlay error values with respect to the positions, wherein the intrafield overlay errors include intrafield translation, isotropic magnification, reticle rotation, asymmetric magnification and asymmetric rotation, and the interfield overlay errors include interfield translation, scale error, wafer rotation and orthogonality error, wherein a pattern of the interfield sampling comprises at least four fields having four different X-coordinates and four different Y-coordinates and the X-coordinates and the Y-coordinates are wafer coordinates relate to the center of the wafer, wherein each field is apart from a center of the wafer by at least 50% of a radius of the wafer, and an angle between any two fields with respect to the center of the wafer is at least 30°.

2. The method of claim 1, wherein the coefficients are estimated using a least square method in the fitting.

3. The method of claim 1, wherein the overlay error model is expressed as the following simultaneous polynomial equations:

$$d_{x+X} = T_{x+X} + S_X X - (\theta_w + \phi) Y + (M_i + M_a) x - (\theta_r + \theta_a) y + \epsilon_{x+X} \quad (1)$$

$$d_{y+Y} = T_{y+Y} + S_Y Y + \theta_w X + (M_i - M_a) y + (\theta_r - \theta_a) x + \epsilon_{y+Y} \quad (2)$$

wherein x and y are intrafield coordinates;

X and Y are interfield coordinates;

$d_{x+X}$ is the sum of the intrafield and interfield overlay errors in x-axis direction;

$d_{y+Y}$ is the sum of the intrafield and interfield overlay errors in y-axis direction;

$T_{x+X}$ is the sum of the intrafield and interfield translation overlay errors in x-axis direction;

$T_{y+Y}$ is the sum of the intrafield and interfield translation overlay errors my-axis direction;

$S_X$ is a scale in x-axis direction;

$S_Y$ is a scale in y-axis direction;

$\theta_w$ is a coefficient of wafer rotation;

$\phi$ is an orthogonality error;

$M_i$ is a coefficient of isotropic magnification;

$M_a$ is a coefficient of asymmetric magnification;

$\theta_r$ is a coefficient of reticle rotation;

$\theta_a$ is a coefficient of asymmetric rotation; and $\epsilon_{x+X}$ and $\epsilon_{y+Y}$ are residue overlay errors in x-axis direction and in y-axis direction, respectively.

4. The method of claim 1, wherein the pattern of the interfield sampling further comprises a field around the center of the wafer.

5. The method of claim 4, wherein the distance between the center of the wafer and the field around the center is no more than 1/15 of the radius of the wafer.

6. The method of claim 1, wherein a pattern of the intrafield sampling comprises at least five positions with four around four corners of a field and one around the center of the field.

7. The method of claim 1, wherein
a pattern of the intrafield sampling comprises at least four positions around four corners of a field.

8. The method of claim 7, wherein the pattern of the intrafield sampling further comprises a position around the center of the field.

9. The method of claim 7, wherein the pattern of the interfield sampling further comprises a field around the center of the wafer.

10. The method of claim 9, wherein the distance between the center of the wafer and the field round the center is no more than 1/15 of the radius of the wafer.

11. The method of claim 7, wherein the pattern of the intrafield sampling further comprises a position around the center of the field, and the pattern of the interfield sampling further comprises a field around the center of the wafer.

* * * * *